United States Patent [19]

Hashimoto et al.

[11] 3,829,888

[45] Aug. 13, 1974

[54] SEMICONDUCTOR DEVICE AND THE METHOD OF MAKING THE SAME

[75] Inventors: Norikazu Hashimoto, Hachioji; Toshiaki Masuhara, Tokorozawa, both of Japan

[73] Assignee: Hitachi, Ltd., Tokyo, Japan

[22] Filed: Jan. 4, 1972

[21] Appl. No.: 215,375

[30] Foreign Application Priority Data

Jan. 8, 1971 Japan .................................. 46-248

[52] U.S. Cl. ..........................................357/41

[51] Int. Cl. .......................................... H01l 11/19

[58] Field of Search...... 317/235 G, 235 B; 307/304

[56] References Cited

UNITED STATES PATENTS

| | | | |
|---|---|---|---|
| 3,502,950 | 3/1970 | Nigh et al. | 317/235 |
| 3,632,438 | 1/1972 | Carlson et al. | 317/235 |

OTHER PUBLICATIONS

Electronics, "Adding Alumina & ives 2,048 bit ROM Chip", Oct. 26, 1970, 2 pages.

*Primary Examiner*—Jerry D. Craig
*Attorney, Agent, or Firm*—Craig & Antonelli

[57] ABSTRACT

A semiconductor device comprising a p type semiconductor substrate including an n channel depletion mode metal-oxide-semiconductor field effect transistor provided with a gate insulating double layer formed of a silicon oxide layer and a phosphosilicate glass layer and an n channel enhancement mode metal-oxide-semiconductor field effect transistor provided with a gate insulating double layer formed of a silicon oxide layer and an alumina layer, the portions of the semiconductor substrate other than those where the field effect transistors are formed being provided with a double layer of a silicon oxide layer and an alumina layer, or of an alumina layer and a phosphosilicate glass layer.

4 Claims, 23 Drawing Figures

SEMICONDUCTOR DEVICE AND THE METHOD OF MAKING THE SAME

BACKGROUND OF THE INVENTION

1. Field of the Invention

This invention relates to a semiconductor device including more than one metal-oxide-semiconductor (MOS) field effect transistors (FET) of different threshold voltage and a method of making the same, and more particularly to a semiconductor device including in the same semiconductor substrate at least one enhancement mode and one depletion mode MOS FETs of desired threshold voltage and a method of making the same. The present semiconductor device is characterized by the feature that it is almost free from the outside stimulas and the influence of ambient impurities and has very stable characteristics.

2. Description of the Prior Art

Conventional MOS type semiconductor integrated circuits (IC) are mostly formed of enhancement mode MOS FETs.

Semiconductor devices formed of only enhancement mode MOS FETs, for example, a two-input NAND circuit shown in FIG. 1, have the following drawbacks:

1. Two power sources are necessary;
2. Required source voltage is high and the power consumption is large; and
3. Impedance in the off-state is high and the transient response speed is low.

In FIG. 1, numerals 1, 2 and 3 indicate enhancement mode MOS FETs, 4 and 5 signal input terminals, 6 a signal output terminal, and 7 and 8 power source terminals.

Here, if a depletion mode MOS FET is used as a load to form, for example, a two-input NAND circuit as shown in FIG. 2, the above drawbacks can be solved and further the following advantages can be obtained:

1. it needs only one power source, and the area needed for wiring source line is reduced;
2. Required source voltage is low and the power consumption is small; and
3. Impedance in the off-state is small and the transient response is fast.

In FIG. 2, numerals 10 and 11 indicate enhancement mode MOS FETs, 12 a depletion mode MOS FET, 13 and 14 signal input terminals, 15 a power source terminal, and 16 a signal output terminal.

As is described above, if an enhancement mode and a depletion mode MOS FETs are formed in a same semiconductor substrate, a very excellent semiconductor device can be provided. Therefore, for forming MOS FETs of different operational mode in a same semiconductor substrate, various methods have been proposed, for example, as follows.

Referring to FIG. 3, wherein a publically known MOSFET is illustrated, heavily doped regions 21, a silicon oxide $SiO_2$ layer 22, a metal oxide, for example alumina $Al_2O_3$, layer 23 are successively formed in and on a p type semiconductor substrate 20 by impurity diffusion, thermal oxidization, chemical vapor deposition, etc. Next, that portion of the $Al_2O_3$ layer 23 which forms the gate of a depletion mode MOS FET $Q_2$ is removed by etching and then electrodes of desired shape 24, 25, 26, 24', 25' and 26' are formed of a conducting material. Thus, an enhancement mode MOS FET $Q_1$ having a gate insulating layer made of an $SiO_2$ layer 22 and an $Al_2O_3$ layer 23 and a depletion mode MOS FET $Q_2$ having a gate insulating layer made only of an $SiO_2$ layer 22 are formed respectively.

According to the above method, however, the gate insulating layer of the depletion mode MOS FET $Q_2$ has only a single layer structure made of the $SiO_2$, and hence it is weak against the elctrical shocks and easily influenced by impurities such as sodium ions. Thus, this method is accompanied with a drawback that the characteristics of formed devices are not so constant.

In order to solve the above drawback, there has been proposed a method in which an enhancement mode MOS FET $'_1$ and a depletion mode MOS FET $Q'_2$ of the structure shown in FIG. 4 are formed by diffusing phosphorus into an $SiO_2$ layer 22 to form a surface layer of $SiO_2$ containing phosphorus oxide (usually called phosphosilicate glass) and then depositing an $Al_2O_3$ layer 23 thereon.

According to said method, the depletion mode MOS FET $Q'_2$ has a gate insulating layer made of a double layer and has good electrical characteristics, but in the enhancement mode MOS FET $Q'_1$ the gate insulating layer comprises a triple layer of the $SiO_2$ layer 22, the phosphosilicate glass layer 27 and the $Al_2O_3$ layer 23 and the phosphosilicate glass layer 27 attracts carriers of a sign similar to that of the carriers attracted by the $SiO_2$ layer 22, and hence it is more diffcult to arrange it in enhancement mode compared with the usual enhancement mode MOS FET having a gate insulating layer made of a double layer of $Al_2O_3$ and $SiO_2$. Further, since phosphorus oxide diffuses from the phosphosilicate glass layer 27 into the $Al_2O_3$ and layer 23 deposited on the surface, in forming apertures for electrode deposition in the $SiO_2$ layer 22 resistivity against the etchant made of a mixture of ammonium fluoride and fluoric acid is reduced and the size precision of the MOS FET is decreased.

SUMMARY OF THE INVENTION

An object of this invention is to solve the above-mentioned drawbacks and to provide a semiconductor device including in a same semiconductor substrate a stable enhancement mode and a stable depletion mode MOS FET and a method of making the same.

According to a feature of ths invention, there is provided a semiconductor device comprising a first and a second n channel MOS FET in the surface portion of a p type semiconductor substrate, the first n channel MOS FET having a gate insulating layer made of at least one insulating film containing phosphorus oxide, the second n channel MOS FET having a gate insulating layer made of at least one insulating film including metal oxide, e.g., $Al_2O_3$, but not phosphorus oxide, and a method of making a semiconductor device comprising a step of forming a phosphosilicate glass layer on a semiconductor substrate using a single $Al_2O_3$ layer or a double layer of $Al_2O_3$ and $SiO_2$ as a mask by diffusion, chemical vapor deposition, etc., to utilize the resultant layer as the insulating layer of a depletion mode MOS FET, thus enabling the formation of a depletion mode MOS FET in a same semiconductor substrate with an enhancement mode MOS FET without affecting the enhancement mode MOS FET.

DESCRIPTION OF THE PREFERRED EMBODIMENTS

Embodiment 1

Figure 1:
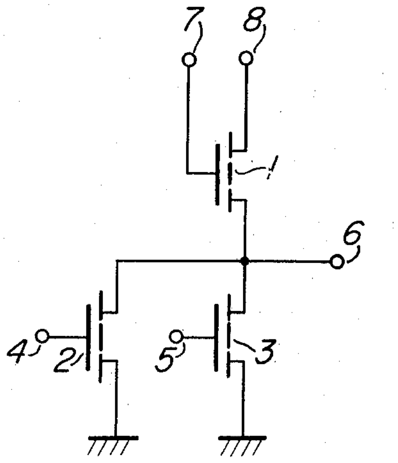
FIG. 1 is a NAND circuit diagram using an enhancement mode MOS FET as a load of enhancement mode MOS FET.
Figure 2:
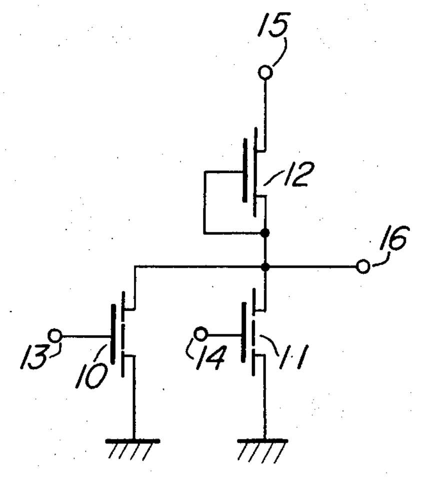
FIG. 2 is a NAND circuit diagram using a depletion mode MOS FET as a load of enhancement mode MOS FET.
Figure 3:
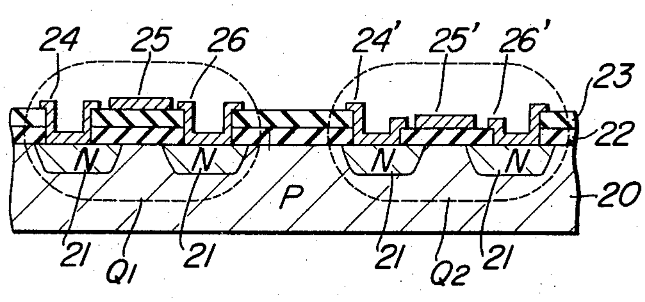
FIGS. 3 and 4 are partially elevated longitudinal cross section of conventional semiconductor devices. The device shown in FIG. 3 is one which is publically known.
Figure 4:
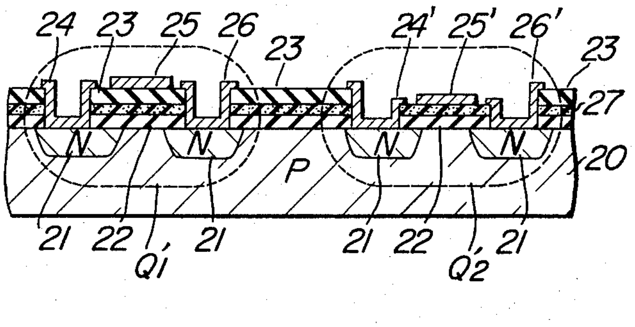
Figure 5A:
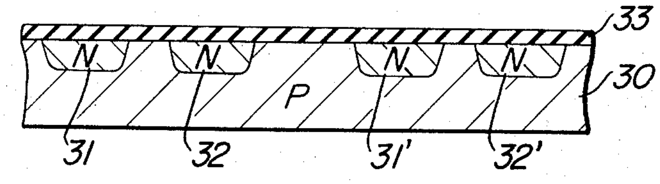
FIGS. 5*a* to 5*d* show various steps of manufacture of an *n* channel depletion mode MOS FET and an *n* channel enhancement mode MOS FET according to an embodiment of the invention.

FIG. 5*a* shows a step where $n^+$ type regions 31, 32, 31' and 32' are formed in p type silicon substrate 30 by impurity diffusion using a mask and then an $SiO_2$ layer 33 is formed on the surface by oxidization.

Figure 5B:
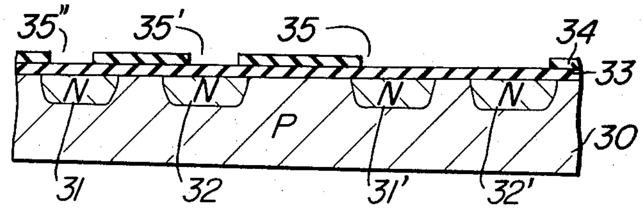

Then, as is shown in FIG. 5*b*, an $Al_2O_3$ layer 34 is deposited by chemical vapor deposition (CVD) and apertures 35, 35' and 35'' extending to $SiO_2$ layer 33 are formed by etching using a mask.

The thicknesses of said $SiO_2$ layer 33 and said $Al_2O_3$ layer 34 are respectively 500 A and 2,000 A. However, the thicknesses of these layers 33 and 34 are not limited to these values.

For example, when a silicon substrate containing boron of about $1 \times 10^{15}$ atoms/cc is used as the substrate and aluminum is used as the gate electrode metal, the thicknesses of the $SiO_2$ layer 33 and the $Al_2O_3$ layer 34 are possibly in the ranges of 200 to 1,000 A and 400 to 2,500 A, respectively.

Further, it is apparent that the thicknesses of the $SiO_2$ layer 33 and the $Al_2O_3$ layer 34 can be altered appropriately by changing the impurity concentration of the substrate and the kind of gate electrode metal.

Here, the CVD for forming the $Al_2O_3$ layer 34 is done, for example, by using a mixture gas of $AlCl_3$, $H_2$ and $CO_2$ and heating the system to a temperature of 800 to 900°C. An $Al_2O_3$ layer of about 2,000 A was formed by performing this CVD for 10 minutes. Then, the etching treatment for opening apertures in the $Al_2O_3$ layer is performed with heated phosphoric acid at 130° to 170°C. In this step, the etch speed for $SiO_2$ is only about 1 A/min and thus the etch of $SiO_2$ can be practically neglected. Thus, apertures 35, 35' and 35'' can be formed by the above procedure with almost no influence of the $SiO_2$ layer.

Figure 5C:
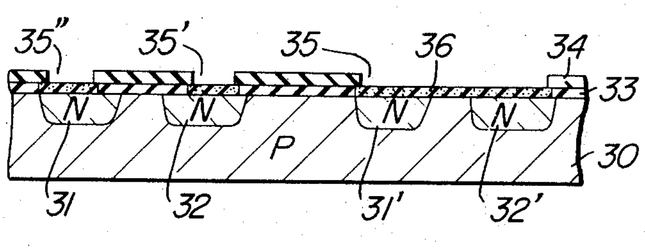

FIG. 5*c* shows the step of phosphosilicate glass formation, where phosphorus is diffused in the surface portion of the $SiO_2$ layer 33 using the $Al_2O_3$ layer as a mask to form phosphosilicate glass 36 having a thickness of about 200 A in the surface portion of the $SiO_2$ layer 33. As an example of phosphosilicate glass formation, the structure shown in FIG. 5*b* was mounted in a diffusion furnace, heated to 900°C, and mixture gas of $POCl_3$, $N_2$, and $O_2$ was allowed to flow to contact the structure.

A phosphosilicate glass layer of a thickness about 200 A is formed by this diffusion for 20 minutes.

The amount of $N_2$ in the mixture gas compared with that of $O_2$ was found to be preferably large, and in this embodiment phosphosilicate glass was formed at a ratio of $N_2 : O_2 = 10 : 1$.

In the case of contacting a mixture gas consisting of only 10 parts of $N_2$ and one part of $O_2$, the surface of the silicon substrate 30 was not oxidized and the thickness of the $SiO_2$ layer 33 never increased. Mixing $POCl_3$ in the gas mixture, the surface of the silicon substrate 30 was oxidized and the thickness of the $SiO_2$ layer 33 in the portions exposed by the apertures 35, 35' and 35'' increased along with the formation of phosphosilicate glass.

For example, a $SiO_2$ layer 33 of a thickness 600 A was formed on a silicon substrate 30. Then the substrate was heated to 900°C, and a mixture gas of $POCl_3$, $N_2$ and $O_2$ was allowed to flow and contact the substrate for 30 minutes. Then, the thickness of the $SiO_2$ layer 33 in the portions exposed by the apertures 35, 35' and 35'' increased by about 400 A and amounted to 1,000 A. In this step, there is a possibility in the $Al_2O_3$ layer 34 of forming compounds including Al and P such as $AlPO_4$, but at temperatures around 900°C the amount of such produced compounds can be neglected and further the reduced by taking the ratio of $N_2/O_2$ larger.

The thickness of the $SiO_2$ layer 33 in the portion covered with the $Al_2O_3$ layer 34 was not changed practically by the above treatment.

Figure 5D:
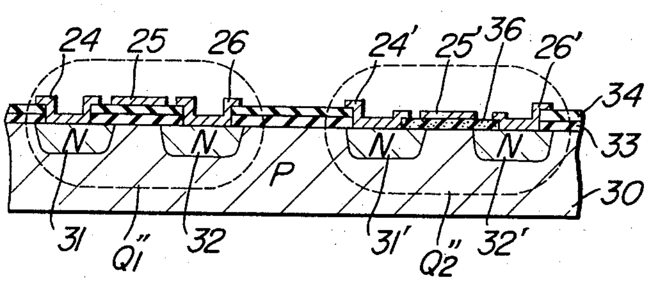

Then, as is shown in FIG. 5*d*, after removing the phosphosilicate glass layer in source and drain portions good conductor metal is deposited at the desired portions by the known method to form electrodes 24, 25, 26, 24', 25' and 26'. Thus, a MOS FET $Q''_1$ having a gate insulating layer made of the $SiO_2$ layer 33 and the $Al_2O_3$ layer 34 and another MOS FET $Q''_2$ having a gate insulating layer made of phosphosilicate glass layer 36 are formed.

Since the gate insulating layer of the MOS FET $Q''_1$ consists of two layers of the $SiO_2$ layer 33 and the $Al_2O_3$ layer 34, it is easy to make the MOS FET $Q''_1$ in enhancement mode by appropriately selecting the thicknesses of the two layers.

For example, in case of using a silicon body including boron of about $1 \times 10^{15}$ atoms/cc and aluminum respectively as the substrate and the gate electrode metal, when the thicknesses of the $SiO_2$ and the $Al_2O_3$ layers 33 and 34 are about 500 A and about 2,000 A, the formed MOS FET $Q''_1$ becomes of enhancement mode.

Also, since the gate insulating layer of the other MOS FET $Q''_2$ is made of a single layer of phosphosilicate glass 36, there can be provided extremely more stable electrical characteristics of a depletion mode MOS FET compared with the conventional depletion mode MOS FET having a single gate insulating layer of $SiO_2$.

Embodiment 2

Figure 6A:
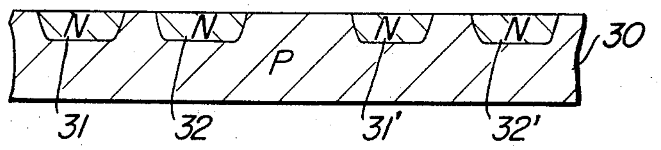
FIGS. 6*a* to 6*d* show various steps of manufacture of an n channel enhancement mode and an n channel depletion mode MOS FET according to another embodiment of the invention.

As is shown in FIG. 6*a*, $n^+$ type regions 31, 32, 31′ and 32′ are formed in a p type silicon substrate 30 by selective diffusion. Next, an $SiO_2$ layer 33, an $Al_2O_3$ layer 34, and an $SiO_2$ layer 37 are successively deposited on the substrate 30 by the known method such as thermal oxidization and CVD.

The thicknesses of the deposited $SiO_2$ layer 33, and $Al_2O_3$ layer 34 and the $SiO_2$ layer 37 can be changed to various values according to the kinds of the substrate and the gate electrode metal. For example, in the case of using a silicon substrate including boron of about 3 $\times 10^{15}$ atoms/cc and the aluminum gate metal, and the thicknesses of the $SiO_2$ layer 33, the $Al_2O_3$ layer 34 and the $SiO_2$ layer 37 are selected to be 500 A, 1,500 A and 5,000 to 6,000 A, respectively.

Figure 6B:
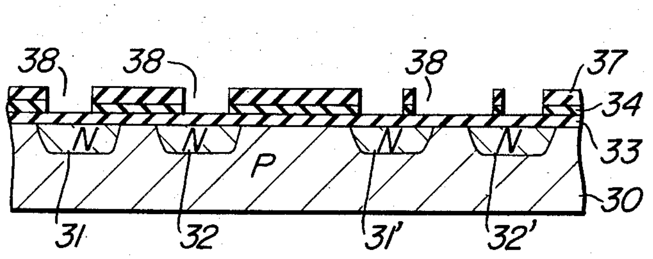

The portions of the $SiO_2$ layer 37 and the $Al_2O_3$ layer 35 corresponding to the gate of a depletion mode MOS FET and the source and drain electrodes of an enhancement mode MOS FET are removed by etching to open apertures 38, 38′ and 38″ extending to the $SiO_2$ layer 33 as is shown in FIG. 6b.

Figure 6C:
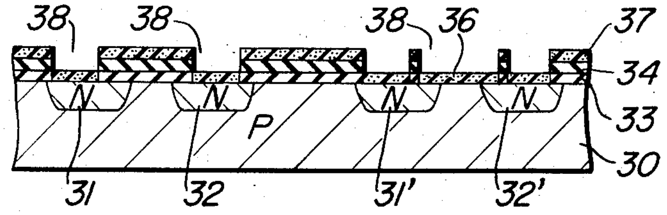

Using the $SiO_2$ layer 37 and the $Al_2O_3$ layer 34 as a mask, phosphorus is diffused on the surface. Then, as is shown in FIG. 6*c*, phosphosilicate glass is produced in the $SiO_2$ layer 37 and the exposed portions of the $SiO_2$ layer 36.

Figure 6D:
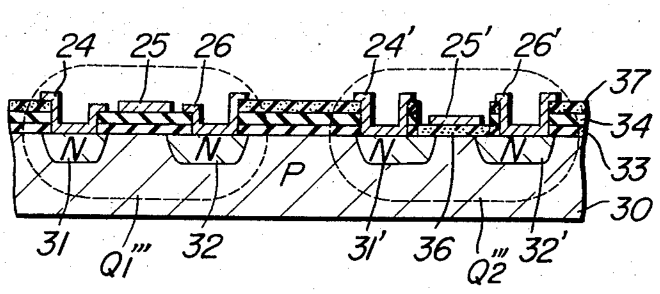

Removing the $SiO_2$ layer 37 in the portion corresponding to an enhancement mode MOS FET and the $SiO_2$ layer 36 in the portions corresponding to source and drain electrodes by etching, electrodes 24, 25, 26, 24′, 25′ and 26′ are deposited as is shown in FIG. 6*d*. Thus, an enhancement mode MOS FET $Q'''_1$ having a gate insulating layer made of the $SiO_2$ layer 33 and the $Al_2O_3$ layer 34 and a depletion mode MOS FET $Q'''_2$ having a gate insulating layer made of the phosphosilicate glass layer 36 are respectively formed.

In this embodiment, since phosphorus is diffused with the mask made of the $SiO_2$ layer 37 formed on the $Al_2O_3$ layer 34, diffusion of phosphorus into the $Al_2O_3$ layer 34 can be perfectly prevented and hence there is caused no affect due to phosphorus. Further, since respective MOS FETs are isolated by the triple layer of the $SiO_2$ layer 33, the $Al_2O_3$ layer 34 and the phosphosilicate glass layer 37, this embodiment is further improved compared with the embodiment 1 in many respects, such as increasing the threshold voltage and reducing the capacitance of the parasitic MOS FET.

Embodiment 3

FIGS. 7*a* to 7*d* show the another process of making an n-channel enhancement and depletion mode MOS FETs on a p type-silicon substrate including impurities of about $10^{15}$ atoms/cc therein.

Figure 7A:
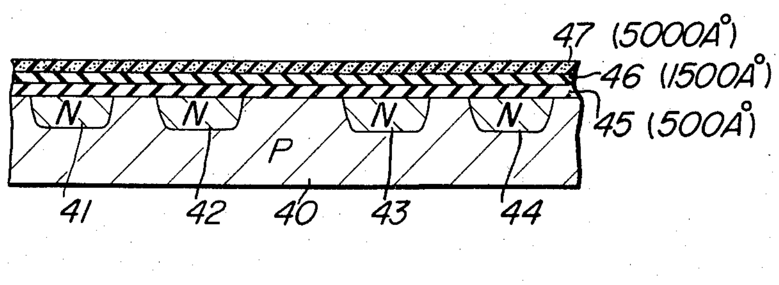
FIGS. 7*a* to 7*d* show various steps of manufacture of an enhancement mode and a depletion mode MOS FET according to further embodiment of the invention.

Referring to FIG. 7*a* the semiconductor regions of n conductivity type are formed by selective diffusion of n-type impurity using a silicon dioxide layer as a mask for impurity diffusion. After formation of the n-conductivity type-semiconductor regions 41 to 44 which serve as source and drain regions of the MOS FETs, the silicon dioxide mask is completely removed from the surface of the silicon substrate, and if nedessary, exposed surface is slightly etched in order to reduce noise of the MOS FETs.

Figure 7B:
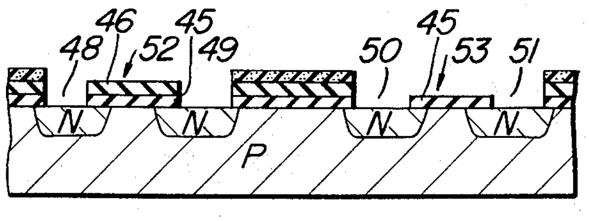
Figure 7C:
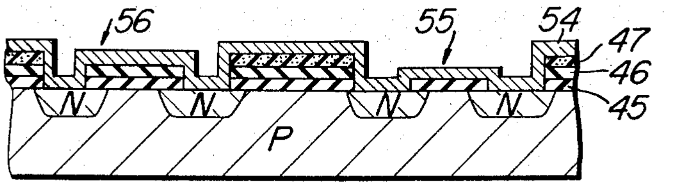

A new silicon oxide layer 45 of about 500 A thickness is provided on the surface of the silicon substrate by a well known method and thereafter an alumina layer 46 of about 1,500 A is provided of the silicon dioxide layer 45 by thermal decomposition of aluminum organic compound. Further, a phospho-silicate glass layer 47 of about 5,000 A is provided on the alumina layer 46 by the chemical vapor deposition method in which for example, the silicon substrate is heated in the mixture gas of phosphin ($pH_3$), monosilane ($SiH_4$) and oxygen at a temperature of about 500°C. Next, the resultant triple layer consisting of the silicon dioxide layer 45, the alumina layer 46 and the phospho-silicate glass layer 47 is selectively etched away in order to expose the surface of the semiconductor regions 41 to 44 of n-type and to leave only layer 52 consisting of the silicon dioxide layer 45 and the alumina layer 46 on the surface of the semiconductor substrate (it serves as a gate region of MOS FET of n-channel enhancement mode) between two n-type semiconductor regions 41 and 42 and to leave only one layer 53 consisting of the silicon dioxide layer 45 on the portion of the substrate surface (serving as a gate region of n-channel depletion mode-MOS FET) between two n-type semiconductor regions 43 and 44 as shown in FIG. 7*b*. According to the present embodiment, a double layer 52 serves as a gate insulator of the n-channel enhancement mode MOS FET.

A thin phospho-silicate glass layer 54 of about 500 A is then deposited on the phospho-silicate glass layer 45, the alumina layer 46 and the silicon dioxide layer 45. The phosphorus concentration in the deposited phosphosilicate glass layer 54 is desirably in the range of 4 to 10 mol percent. It is well known that the phosphosilicate glass on the silicon dioxide layer works to set the electrical characteristics of semiconductor device stable. According to the present invention, the double layer 55 of a silicon dioxide layer and a phosphosilicate glass layer is used as a gate insulator of an n-channel depletion mode-insulated gate field effect transistor. After deposition of the phospho-silicate glass layer 54, only the phosphosilicate glass layer on the n-type semiconductor regions 41 to 44 and if necessary, on the gate insulator 52 is selectively removed by the photo-etching technique.

Finally, to form electrodes 57 to 62 and/or interconnection wiring metal layer 63 of a semiconductor device comprising n-channel enhancement and depletion mode MOS FETs an aluminum layer of about 5,000 A thickness is deposited on and over the surface of the substrate and selectively removed therefrom by the photo-etching techniques.

Figure 7D:
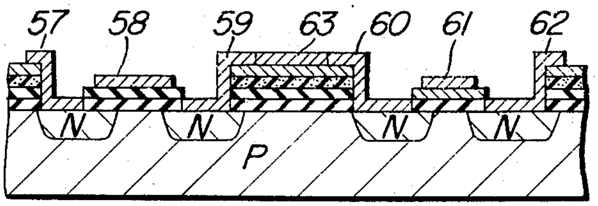

By the above-mentioned process, n-channel enhancement and depletion mode MOS FETs are provided in the surface of the p type semiconductor substrate as shown in FIG. 7*d*.

As is clear from the Figures, the n-channel-enhancement mode MOS FET has a double layer of the silicon dioxide layer and the alumina layer as a gate insulator of the MOS FET. On the other hand, the n-channel depletion mode MOS FET has a double layer of the silicon dioxide layer and the phospho-silicate glass layer. Furthermore, the surface of the semiconductor substrate between the two MOS FETs is covered with a triple layer of the silicon dioxide layer, the alumina layer and the phospho-silicate glass layer. The total thickness of the triple layer is about 7,500 A and has a large thickness in comparison with the two gate insulators. Therefore, the parasitic capacitance between an interconnection wiring metal layer and the semiconductor substrate is very small and contaminations from the interconnection wiring metal layer is prevented by the phospho-silicate glass layer thereunder.

By the effect of the alumina layer 46, a lot of positive charges are induced in the surface of the semiconductor substrate thereunder, therefore two MOS FETs are electrically isolated.

The threshold voltages of such MOS FETs are about plus 1 volt and minus 1 volt.

Embodiment 4

FIGS. 8*a* to 8*g* show another process of making n-channel enhancement and depletion mode MOS FETs in the p-type silicon substrate.

Figure 8A:
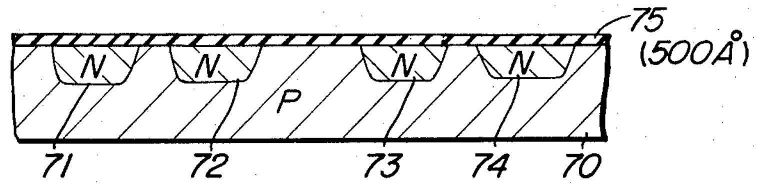
FIGS. 8*a* to 8*g* show various steps of manufacture of an enhancement mode and a depletion mode MOS FET according to another embodiment of the invention.

Referring to FIG. 8*a*, the semiconductor regions 71 to 74 of n type are formed in the p type silicon substrate 70 by selective diffusion of an n-type impurity using a silicon dioxide mask. The semiconductor regions 71 to 74 serve as source and drain regions of MOS FETs, respectively. After formation of the source and the drain regions, the silicon dioxide mask is completely removed from the surface of the silicon substrate and if necessary, the exposed surface thereof is slightly etched by an etchant.

A new silicon dioxide layer of about 500 A is then formed on the surface of the silicon substrate by a well known method such as the thermal oxidization and the thermal decomposition of monosilane in oxidizing atmosphere.

Figure 8B:
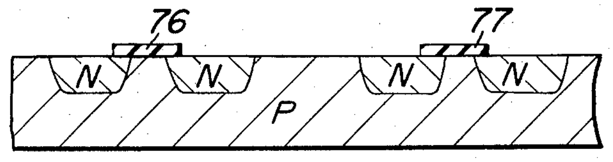

Next, the silicon dioxide layer 75 is selectively removed by the photo-etching technique except portions 76 and 77 as shown in FIG. 8*b*. The layers 76 and 77 must cover the surface of substrate regions 70 (serving as gate regions of MOS FETs) between the n-type regions.

Figure 8C:
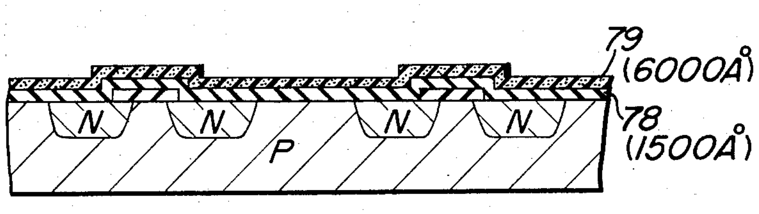
Figure 8D:
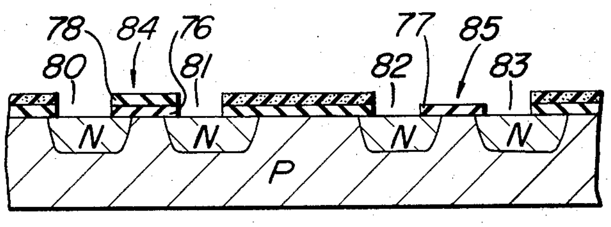
Figure 8E:
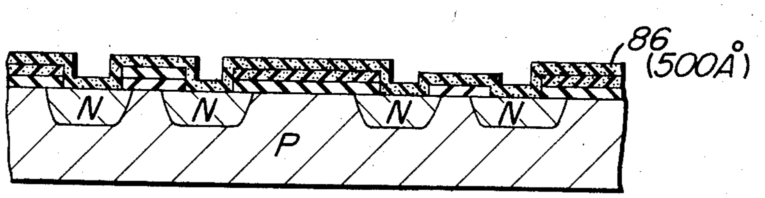
Figure 8F:
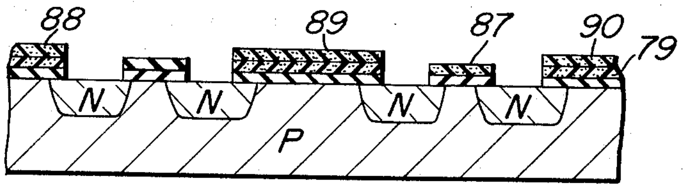
Figure 8G:
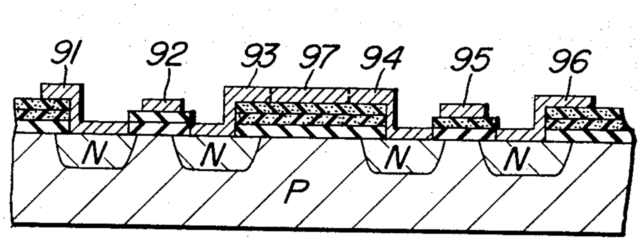

On the surface of the substrate, an alumina layer 78 of 1,500 A thickness and a silicon dioxide layer or a phosphosilicate glass layer 79 of about 6,000 A are successively deposited by the well known method of chemical vapor deposition as shown in FIG. 8*c* and selectively etched to expose the surface of the n-type regions 71 to 74 and to leave a double layer 84 of the silicon dioxide layer 76 and the alumina layer 78 and a single layer 85 consisting of the silicon dioxide layer 77 on the two gate regions, respectively, as shown in FIG. 8*d*.

Thin phospho-silicate glass layer 86 of about 500 A thickness is then deposited on and over the substrate and the glass layer except layers 87 to 90 are removed therefrom.

Finally, to form electrodes 91 to 96 and/or interconnection wiring metal layer 97 of a semiconductor device comprising n-channel enhancement and depletion mode MOS FETs, an aluminum layer of about 5,000 A thickness is deposited over the surface of the substrate and selectively removed therefrom by the photoetching technique.

From many experiments done by the present inventors, the following values are recommended for designing various circuits. The threshold voltage of n-channel enhancement mode MOS FETs is in the range of +0.5 to +1.5 V, and that of n-channel depletion mode MOS FETs is in the range of 0 to −2 V. For obtaining the above values, the surface concentration of impurity in the p type silicon substrate is in the range of $1 \times 10^{14}$ to $5 \times 10^{16}$ atoms/cc, and the gate insulator of MOS FET is in the range of 500 to 1,500 A in the effective film thickness T. Here, the effective total film thickness T calculated on the reference of $SiO_2$ film thickness in the case of a double layer of an $SiO_2$ layer and an $Al_2O_3$ layer is expressed by, $$T = T_{SiO_2} + 3.8/9.0 \times T_{Al_2O_3},$$

where, $T_{SiO_2}$ denotes the thickness of the $SiO_2$ layer, and $T_{Al_2O_3}$ that of the $Al_2O_3$ layer.

In the case of a double layer of an $SiO_2$ layer and a phosphosilicate glass layer, the effective thickness is expressed by $$T \doteqdot T_{SiO_2} + T_{PSG},$$

where $T_{PSG}$ denotes the thickness of the phosphosilicate glass layer.

The ranges for the respective layers constituting the gate insulating layer which satisfy the above conditions and are relatively easy to manufacture are as follows:

$SiO_2$ layer : 200 to 1,000 A
$Al_2O_3$ layer : 400 to 2,500 A
PSG layer : 100 to 1,000 A $SiO_2$ layer of thicknesses below 200 A is difficult to manufacture and further makes the electrical characteristics of a pn junction unstable. Those of thicknesses above 1,000 A reduces the threshold voltage outside said desired range.

In $Al_2O_3$ layers of thicknesses below 400 A, pin holes are apt to be formed and weaken the function as a barrier against metal ions, such as $Na^+$, and hence make the electrical characteristics unstable. When the thickness of an $Al_2O_3$ layer exceeds 2,500 A, the electrical characteristics of the element thereunder becomes unstable due to polarization effect of $Al_2O_3$, etc.

The thickness *T* of a phosphosilicate glass layer is determined based on the limitation for *T* for the similar reasons with those for the silicon oxide layer.

The phosphorus concentration in the phosphosilicate glass layer is preferably in the range of 4 to 10 mol percent.

In the above embodiments of the invention, an $Al_2O_3$ layer is used as a metal oxide layer, but other metal oxide layers, for example those of Ni, Ti, Zr, Ta, Th, V, Fe, Zn, and Cu, can be similarly used. However, compared with the other metal oxide, $Al_2O_3$ is more frequently used by the reasons that processing is easy, precise processing is possible, and $Al_2O_3$ has a larger ability of inducing positive charges at a substrate surface.

In particular, although the specific embodiments are in terms of an n channel device having n type conductivity source and drain regions and a p type substrate, the invention is equally applicable to a p channel device having an n type substrate and p type source and drain regions. Reversal of conductivity type will cause a reversal of polarity of applied voltages. Moreover, it is to be understood that the invention may be applied also to other semiconductor materials such as germanium and the Group III – V compounds. Selection of combination and the thicknesses of the layers to be formed on the substrate will be apparent from the foregoing description for those skilled in the art.

We claim:

1. A semiconductor device comprising:

a semiconductor substrate of p conductivity type;

a first n-channel metal oxide semiconductor field effect transistor of the depletion mode type having a first gate insulating layer consisting of a silicon dioxide layer disposed on said semiconductor substrate and having a thickness of from 200 to 1,000 A and a phospho-silicate glass layer disposed on said silicon dioxide layer and having a thickness of from 100 to 1,000 A;

a second n-channel metal oxide semiconductor field effect transistor of enhancement mode type disposed at a different portion on the semiconductor body from said first metal oxide semiconductor field effect transistor and having a second gate insulating layer consisting of a silicon dioxide layer disposed on said semiconductor substrate and having a thickness of from 200 to 1,000 A and an alumina layer disposed on the silicon dioxide layer having a thickness of from 400 to 2,500 A; and a third insulating layer disposed on that portion of the semiconductor body other than where said first and second metal oxide semiconductor field effect transistors are disposed, which includes a silicon dioxide layer disposed on said semiconductor body and having a thickness of from 200 to 1,000 A and an alumina layer disposed on said silicon dioxide layer and having a thickness of from 400 to 2,500 A.

2. A semiconductor device according to claim 1, wherein the thickness of said first gate insulating layer is in a range of from 500 to 1,500 A.

3. A semiconductor device according to claim 1, wherein the phosphorus concentration in said phospho-silicate glass layer is in a range of from 4 to 10 mol percent.

4. A semiconductor device according to claim 2, wherein the phosphorus concentration in said phospho-silicate glass layer is in a range of from 4 to 10 mol percent.

* * * * *